(12) United States Patent
Wakabayashi et al.

(10) Patent No.: US 6,317,203 B1
(45) Date of Patent: Nov. 13, 2001

(54) NARROWBAND MODULE INSPECTION DEVICE

(75) Inventors: Osamu Wakabayashi, Hiratsuka; Takanori Nakaike, Oyama, both of (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/270,656

(22) Filed: Mar. 16, 1999

(30) Foreign Application Priority Data

Mar. 17, 1998 (JP) ................................................. 10-066979

(51) Int. Cl.[7] ...................................................... G01J 21/00
(52) U.S. Cl. ...................... 356/237.1; 356/326; 356/328; 356/329; 356/450; 356/515; 372/32; 372/102
(58) Field of Search ..................................... 356/318–319, 356/326, 121, 328, 329, 330, 331, 332, 334, 450, 451, 452, 460, 477, 237.1, 515; 372/102, 108, 20, 32

(56) References Cited

U.S. PATENT DOCUMENTS

| | | | |
|---|---|---|---|
| 5,198,872 | * 3/1993 | Wakabayashi et al. | ............... 356/352 |
| 5,218,421 | * 6/1993 | Wakabayashi et al. | ................ 372/32 |
| 5,373,515 | * 12/1994 | Wakabayashi et al. | ............... 356/352 |
| 5,559,816 | * 9/1996 | Basting et al. | ........................ 372/102 |
| 5,748,316 | * 5/1998 | Wakabayashi et al. | ............... 356/352 |
| 6,101,211 | * 8/2000 | Wakabayashi et al. | ............... 372/102 |

FOREIGN PATENT DOCUMENTS

| | | |
|---|---|---|
| 405283785 | * 10/1993 | (JP) . |
| 411274632 | * 10/1998 | (JP) . |
| 02000 216464 | * 8/2000 | (JP) . |

* cited by examiner

Primary Examiner—F. L. Evans
Assistant Examiner—Sang H. Nguyen
(74) Attorney, Agent, or Firm—Varndell & Varndell, PLLC

(57) ABSTRACT

A light that radiates in the wavelength region of a narrowband laser beam is generated, this light is converted to a collimated beam after passing through a slit, and the converted light is incident on a narrowband module. The outputted light from the narrowband module is condensed, and this condensed light is incident on a light detector. A total reflection mirror is provided in a removable manner on the optical path in front of the narrowband module, the ratio between the output of the light detector in a state in which the total reflection mirror is provided on the optical path, and the output of the light detector in a state in which the total reflection mirror is removed, is determined, and the narrowband efficiency of the above-mentioned narrowband module is inspected based on the determined ratio.

9 Claims, 11 Drawing Sheets

MOVES TO ADJUST

NARROWBAND MODULE INSPECTION DEVICE

BACKGROUND OF THE INVENTION

1. Field of the Invention

The present invention relates to a narrowband module inspection device for inspecting the narrowband efficiency, wavelength selection characteristics, and other narrowband performance of a narrowband module.

2. Description of the Related Art

Attention is focusing on the use of excimer lasers as light sources in steppers used in the fabrication of semiconductor devices. This is because numerous outstanding advantages can be expected. These include the capability to extend the lithography limit to 0.35 μm and lower as a result of the short wavelengths of an excimer laser; deeper depth of focus than previously-used mercury lamp g-line and i-line peaks at the same resolution; a large exposure area can be achieved with a small numerical aperture (NA) lens; and high power levels.

However, when this excimer laser is utilized as the light source in a semiconductor exposure system, synthetic quartz is the only lens material capable of being fabricated into an optical system for excimer laser wavelengths (the wavelength of a KrF excimer laser is 248 nm, and that of an argon excimer laser is 193 nm); but a synthetic quartz material alone cannot be furnished with a chromatic aberration function.

For example, in the case of spontaneously emitted energy of a KrF excimer laser, the spectral line width is a wide 300 pm, and left as-is, the chromatic aberration of the exposure system lens cannot be ignored, and resolution sufficient for exposure results cannot be achieved.

Accordingly, when utilizing an excimer laser as the light source of a semiconductor exposure system, the bandwidth of the laser light is narrowed by providing inside the laser resonator a narrowband module, comprising a wavelength selection device, such as an etalon, or grating and prism.

When inspecting the performance of a narrowband module such as this, in the past, the narrowband module was mounted into an actual laser, the actual laser light emitted from the laser chamber was incident on the narrowband module, and the outputted light thereof was inspected.

Consequently, with prior art, there are problems such as (1) an actual laser system is required to confirm the performance of a narrowband module;

(2) it takes time to inspect and adjust a narrowband module; and (3) when the desired performance is not exhibited in the laser output light, it is impossible to specify whether the cause thereof is a malfunction in the narrowband module, a malfunction in another component element, such as the laser chamber, monitor module, or the like, or a discrepancy in the optical axis adjustment of the resonator.

Further, a technology for inspecting the optical characteristics of a diffraction grating used in an optical disc device and the like is disclosed in Japanese Patent Laid-open No. 2-129844. That is, with this prior art, a single-wavelength collimated beam is incident on a diffraction grating, the positional shift between the light-intercepting position of the first-order light from the diffraction grating and a reference light-intercepting position is measured, and the pitch positional shift of the diffraction grating is inspected on the basis of this measured light-intercepting positional shift. Further, with this prior art, a single-wavelength collimated beam is incident on a diffraction grating, the quantity of light of the first-order light from the diffraction grating, and the quantity of light of a zero-order light are measured, and the groove depth of the diffraction grating is inspected based on a comparison of these light quantities.

As for this prior art, although an inspection related to the physical shape of a diffraction grating in an optical disc device can certainly be performed for a diffraction grating unit, this prior art only detects the physical shape of a diffraction grating utilized in an optical disc device and the like, but does not directly detect the bandwidth-narrowing performance of a diffraction grating.

That is, in the field of lasers, such as an excimer laser, there is a need for an inspection device capable of directly inspecting and adjusting, as a narrowband module unit, a variety of narrowband performance, such as the intensity distribution, spectral line width, center wavelength, narrowband efficiency, and wave front shape of the band-narrowed light beam generated from a narrowband module.

SUMMARY OF THE INVENTION

With the foregoing in view, it is an object of the present invention to provide a narrowband module inspection device, which is capable of inspecting the narrowband performance of a narrowband module as a narrowband module unit.

The invention corresponding to a first embodiment is a narrowband module inspection device for inspecting a narrowband performance of a narrowband module, comprising: light source means for generating a light, which radiates in a wavelength region of a narrowband laser beam; a slit on which the light from the light source means is incident; a collimating converter for converting the light via the slit to a collimated beam, and making the converted light incident on the narrowband module; condensing means for condensing outputted light from the narrowband module; a light detector on which light condensed by the condensing means is incident; a total reflection mirror provided in a removable manner on an optical path between the collimating converter and the narrowband module; and inspecting means for determining a ratio between the output of the light detector in a state wherein the total reflection mirror is provided on the optical path, and the output of the light detector in a state wherein the total reflection mirror is removed from the optical path, and for inspecting a narrowband efficiency of the narrowband module based on the determined ratio.

With such an invention, light emitted in a wavelength region oscillated by a narrowband laser, after passing through a slit and being converting to a collimated beam, is incident on a narrowband module, and the outputted light from the narrowband module is condensed, and incident on a light detector. A total reflection lens is provided in a removable manner on the optical path between the collimating converter and the narrowband module, and based on the output of the light detector, the light intensity Ib in a state, wherein the total reflection mirror is provided, and the light intensity in a state, wherein the total reflection mirror is removed, that is, the light intensity In of light, the bandwidth of which has been narrowed by the narrowband module, is determined, and the narrowband efficiency of the narrowband module is inspected by using the ratio In/Ib thereof as an index. This narrowband efficiency greatly affects laser output.

In this manner, in accordance with the present invention, it becomes possible to inspect narrowband efficiency, which affects laser output, and which is extremely important from the standpoint of the performance of the narrowband module, in accordance with an extremely simple constitution, wherein a total reflection mirror is provided in a removable manner on the optical axis. Further, since it is possible to evaluate the narrowband efficiency of a narrowband module unit without using an actual laser, inspection costs and inspection time can be greatly reduced, and narrowband modules can be manufactured and shipped in volume.

In the invention of a second embodiment, the inspection means of claim 1 inspects wavelength selection characteristics of the narrowband module based on the output of the light detector in the state wherein the total reflection mirror is removed from the optical path.

Therefore, in accordance with the present invention, it becomes possible to evaluate the wavelength selection characteristics (selection center wavelength, spectral line width, and so forth) of a narrowband module without using an actual laser, inspection costs and inspection time can be greatly reduced, and narrowband modules can be manufactured and shipped in volume.

The invention corresponding to a third embodiment is a narrowband module inspection device for inspecting a narrowband performance of a narrowband module, comprising: a wideband light source for generating a wideband light; a slit on which the light from the wideband light source is incident; a collimating converter for converting the light via the slit to a collimated beam, and making the converted light incident on the narrowband module; condensing means for condensing outputted light from the narrowband module; a total reflection mirror provided in a removable manner on an optical path between the collimating converter and the narrowband module; a spectrometer for dispersing light condensed by the condensing means; a light detector on which the light dispersed by the spectrometer is incident; and inspecting means for determining a ratio between the output of the light detector in a state wherein the total reflection mirror is provided on the optical path, and the output of the light detector in a state wherein the total reflection mirror is removed from the optical path, and for inspecting a narrowband efficiency of the narrowband module based on the determined ratio.

With the invention corresponding to the third embodiment, a wideband light is incident on a narrowband module, light of a wavelength region of a narrowband laser beam is dispersed in accordance with a spectrometer, and is incident on a light detector. In this invention, too, a total reflection mirror is provided in a removable manner on the optical path between the collimating converter and the narrowband module, and based on the output of the light detector, a light intensity Ib in the state in which the total reflection mirror is provided, and a light intensity in the state in which the total reflection mirror is removed, that is, a light intensity In of light, the bandwidth of which has been narrowed by the narrowband module, is determined, and the narrowband efficiency of the narrowband module is inspected by using the ratio In/Ib thereof as an index.

In this manner, in accordance with the present invention, it becomes possible to inspect narrowband efficiency, which is extremely important from the standpoint of the performance of the narrowband module, in accordance with an extremely simple configuration, wherein a total reflection mirror is provided in a removable manner on the optical axis. Further, since it is possible to evaluate the narrowband efficiency of a narrowband module unit without using an actual laser, inspection costs and inspection time can be greatly reduced, and narrowband modules can be manufactured and shipped in volume.

In the invention of a fourth embodiment, the inspection means of claim 3 inspects wavelength selection characteristics of the narrowband module based on the output of the light detector in the state wherein the total reflection mirror is removed from the optical path.

Therefore, in accordance with the present invention, it becomes possible to evaluate the wavelength selection characteristics (selection center wavelength, spectral line width, and so forth) of a narrowband module without using an actual laser, inspection costs and inspection time can be greatly reduced, and narrowband modules can be manufactured and shipped in volume.

The invention corresponding to a fifth embodiment is a narrowband module inspection device for inspecting a narrowband performance of a narrowband module, comprising: light source means for generating a light, which radiates in a wavelength region of a narrowband laser beam; a collimating converter for converting monochromatic light from the light source means to a collimated beam; an interferometer for dividing the converted collimated beam into two beams, making one of the beams incident on the narrowband module, and causing a return light from the narrowband module to interfere with the other one of the two divided beams; a total reflection mirror provided in a removable manner on an optical path between the collimating converter and the narrowband module; a condensing means for condensing outputted light of the interferometer; a light detector on which light condensed by the condensing means is incident; and inspecting means for determining a ratio between the output of the light detector in a state wherein the total reflection mirror is provided on the optical path, and the output of the light detector in a state wherein the total reflection mirror is removed from the optical path, and for inspecting a narrowband efficiency of the narrowband module based on the determined ratio.

With the invention corresponding to the fifth embodiment, a monochromatic collimated beam irradiated in accordance with an interferometer is split into two beams, one of the beams is incident on the above-mentioned narrowband module, the return light from the abovementioned narrowband module is made to interfere with the other beam of the above-mentioned two beams, and the interfered light thereof, after being condensed, is made incident on a light detector. In this invention, too, a total reflection mirror is provided in a removable manner on the optical path between the collimating converter and the narrowband module, and based on the output of the light detector, the light intensity Ib in a state, wherein the total reflection mirror is provided, and the light intensity in a state, wherein the total reflection mirror is removed, that is, the light intensity In of light, the bandwidth of which has been narrowed by the narrowband module, is determined, and the narrowband efficiency of the narrowband module is inspected by using the ratio In/Ib thereof as an index.

In this manner, in accordance with the present invention, it becomes possible to inspect narrowband efficiency, which is extremely important from the standpoint of the performance of the narrowband module, in accordance with an extremely simple constitution, wherein a total reflection mirror is provided in a removable manner on the optical axis. Further, since it is possible to evaluate the narrowband efficiency of a narrowband module unit without using an actual laser, inspection costs and inspection time can be greatly reduced, and narrowband modules can be manufactured and shipped in volume.

In the invention of the sixth embodiment, the inspection means of the fifth embodiment inspects wavelength selection characteristics of the narrowband module based on an interference fringe produced from the output of the light detector in the state wherein the total reflection mirror is removed from the optical path.

In this manner, in accordance with the present invention, it becomes possible to evaluate the wavelength selection characteristics (selection center wavelength, spectral line width, and so forth) of a narrowband module based on an interference fringe without using an actual laser, inspection costs and inspection time can be greatly reduced, and narrowband modules can be manufactured and shipped in volume.

The inventions of seventh, eighth, and ninth embodiments, in the inventions of the first, third and fifth embodiments, respectively, comprise wave front adjusting means for adjusting a wave front of the incident narrowband laser beam and emitting onto the optical path between the narrowband module and the collimating converter.

With the inventions of the seventh, eighth, and ninth embodiments, since wave front adjustment is possible, it becomes possible to adjust, within the scope of the specifications, the spectral line width, laser beam output, spatial output distribution of a beam cross-section, and the like, which are controlled in accordance with the shape of the wave front emitted from a narrowband module.

DESCRIPTION OF THE PREFERRED EMBODIMENTS

The embodiments of the present invention are described in detail hereinbelow in accordance with the attached figures.

Figure 1:
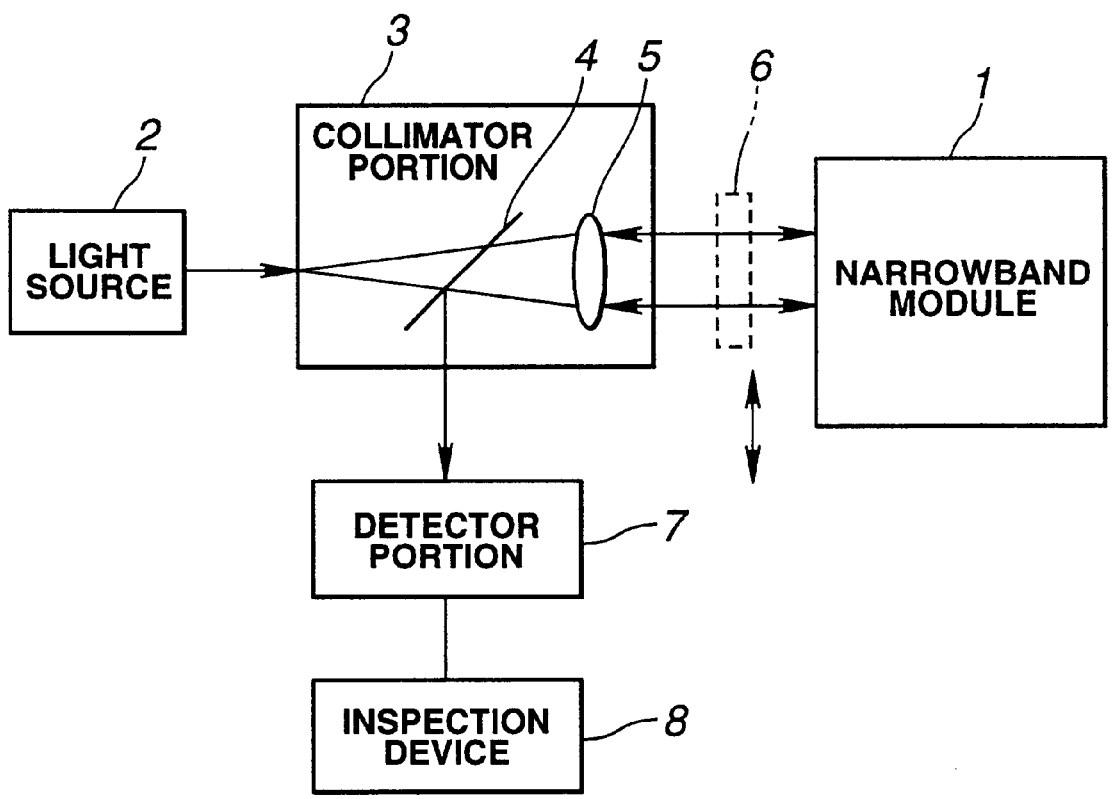
FIG. 1 is a conceptual block diagram showing the basic constitution of an embodiment of the present invention.

FIG. 1 shows the conceptual constitution of an Embodiment of when the present invention is applied to an inspection device for inspecting a narrowband module of an excimer laser.

In FIG. 1, a light source 2 generates a monochromatic light of a wavelength region of a narrowband laser beam generated from a laser system, in which the pertinent narrowband module 1 is mounted. The monochromatic light generated from the light source 2, after being converted to a collimated beam by the collimator portion 3, is incident on the narrowband module 1. The collimator portion 3 has a beam splitter 4 and a collimator lens 5. In the optical path between the collimator portion 3 and the narrowband module 1, a total reflection mirror 6 is provided in a removable manner on this optical path.

Return light from either the narrowband module 1 or the total reflection mirror 6 is deflected in accordance with the beam splitter 4, and is incident on a light detector 7, which comprises either a CCD, or a line sensor or the like. An inspection device 8 inspects various narrowband performance, such as the narrowband efficiency, wavelength selection characteristics, and so forth of the narrowband module 1 on the basis of the detected output of the light detector 7.

That is, when it is a state, wherein the total reflection mirror 6 is provided on the optical path, the spontaneously emitted energy from the light source 2 is incident on the light detector 7, and when the total reflection mirror 6 is removed from the optical path, bandwidth-narrowed light in accordance with the narrowband module is incident on the light detector 7. Narrowband efficiency is determined by finding the ratio of each of the light quantities intercepted thereby, and this serves as the index for determining the laser output of the laser system equipped with this narrowband module 1. Further, by determining the light-intercepting position and so forth of the light detector 7, the spectral structure of the narrowband light outputted from the narrowband module 1 is inspected, and the wavelength selection characteristics thereof are determined.

For example, the following are utilized as the above-mentioned light source 2.

When inspecting a narrowband module of a KrF excimer laser:
   a. 3 low-pressure mercury lamp emission lines, 248.1996 nm, 248.2716 nm, 248.3815 nm (in air)
   b. A 248.3271 nm line of an Fe hollow cathode lamp (in air)
   c. A 248.25 nm line, which is the second harmonic of an argon laser (496.5 nm)
   d. Other emission lines or laser beams between 248.1–248.6 nm When inspecting a narrowband module of a KrF excimer laser:
   a. A 193.7590 nm line of an As hollow cathode lamp (in a vacuum)
   b. A 194.2273 nm line of a low-pressure mercury lamp (in a vacuum)
   c. Other emission lines or laser beams between 193.0–194.3 nm The optical performance of a narrowband module 1 unit is inspected in accordance with the above basic constitution.

Figure 2:
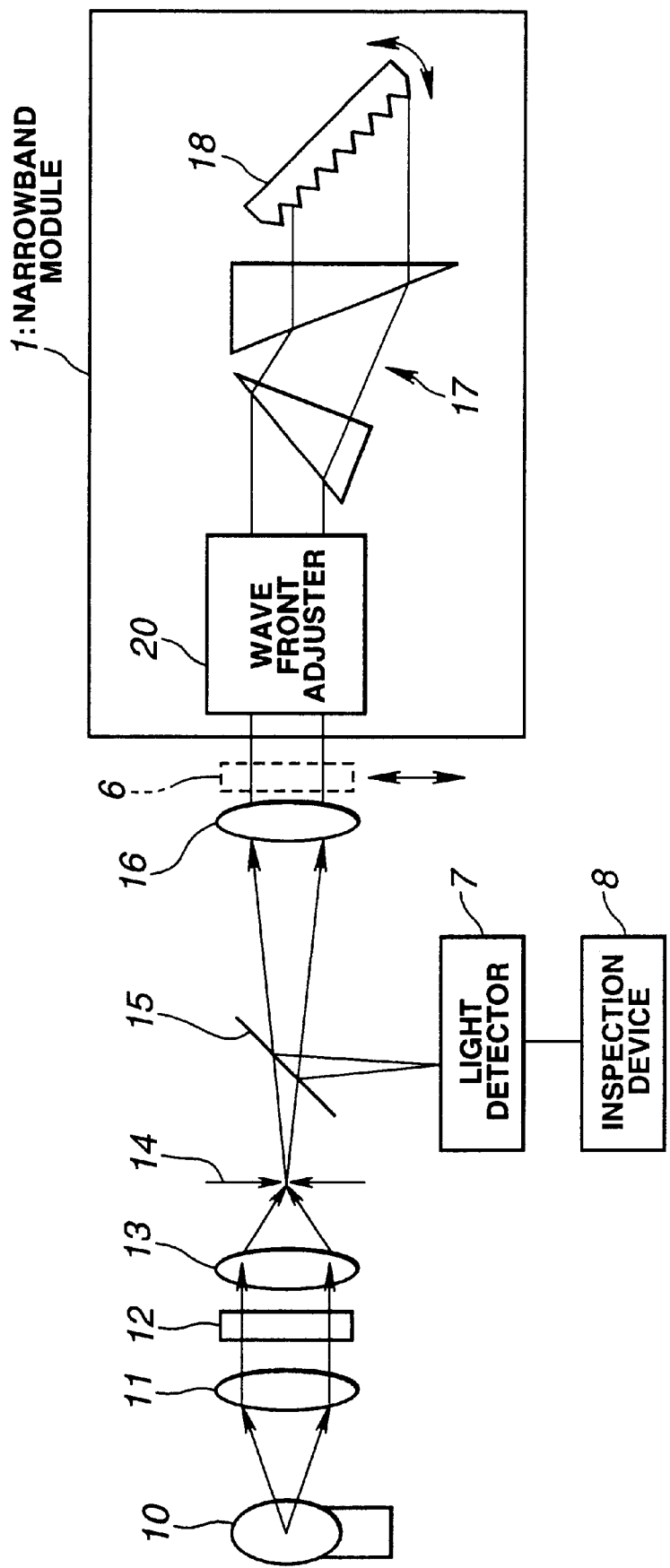
FIG. 2 is a diagram showing an embodiment of the present invention.

A specific embodiment is shown in accordance with FIG. 2.

In FIG. 2, the light of a lamp 10, such as a low-pressure mercury lamp, is converted to a collimated beam by a collimator lens 11, after which, an emission line of a desired wavelength is transmitted via an interference filter 12, and then condensed in accordance with a condensing lens 13. A slit 14 is provided at the focal point location of the condensing lens 13, and light via this slit 14 passes through a beam splitter 15, and after being further converted to a collimated beam in accordance with a collimator lens 16, is incident on a narrowband module 1.

In this case, the narrowband module 1 has a prism beam expander 17 comprising 2 prisms, a diffraction grating 18, and a wave front adjuster 20, and light, the bandwidth of which has been narrowed in accordance with the prism beam expander 17 and diffraction grating 18, is outputted from the narrowband module 1.

In the optical path between the collimator lens 16 and the narrowband module 1, a total reflection mirror 6 is provided so as to be removable from the optical path.

Return light from either the narrowband module 1 or the total reflection mirror 6, after passing through the collimator lens 16 and beam splitter 15, is incident on the light detector 7, which constitutes either a CCD or a line sensor or the like. The inspection device 8 has a monitor, on which the output of the light detector 7 is displayed as the corresponding relationship between the light-intercepting position and light intensity thereof, and various narrowband performance of the narrowband module 1 are inspected based on the detected output of the light detector 7.

The wave front adjuster 20 can convert the wave front of the light incident on the prism beam expander 17 and grating 18 to either a flat wave, convex wave, or concave wave. That is, to exercise more fully the narrowband performance of the narrowband module 1, which is constituted by combining a prism beam expander 17 and a grating 18, the wave front of the light incident thereon is made into either a flat wave, convex wave, or concave wave, and in the case of a convex wave and concave wave, since it is necessary to adjust the two-dimensional radius of curvature thereof, the present invention is constituted so that this adjustment is performed by the wave front adjuster 20. Furthermore, the selection of either a flat wave, convex wave, or concave wave differs in accordance with the characteristic dispersion of the optical device.

FIG. 3 shows various examples of a wave front adjuster 20.

Figure 3A:
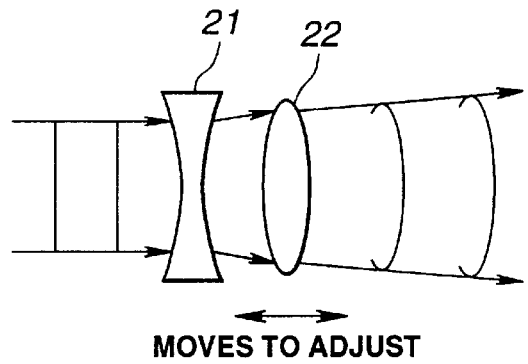
FIGS. 3(a) through 3(d) are diagrams showing specific examples of wave front adjusters.

In FIG. 3(a), the wave front adjuster 20 comprises a concave lens 21 and a convex lens 22, and is constituted so that the convex lens 22 can be moved in the direction of the optical axis in accordance with an appropriate mechanism, and an incident wave front can be converted to either a wave front (concave wave front, convex wave front) having an arbitrary curvature in accordance with the relative position in the optical axis direction of the concave lens 21 and convex lens 22, or a flat wave.

Figure 3B:
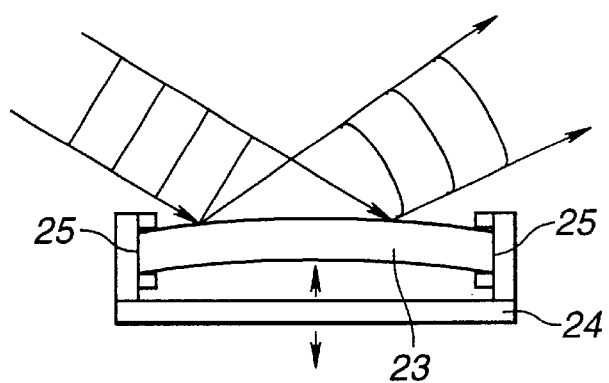

In FIG. 3(b), physical force is actually applied to a reflection-type optical device substrate 23 so as to warp the reflecting surface. That is, both ends of a reflecting mirror 23 are mated to concave portions 25 formed in support members 24, both ends of the reflecting mirror 23 are supported by these concave portions 25, and furthermore, the reflecting surface of the mirror is bent to form either a concave surface or a convex surface in accordance with either pushing or pulling the center portion of the backside of the reflecting mirror 23 using an appropriate mechanism provided in the vicinity of the center of the backside of the reflecting mirror 23.

Figures 3C, 3D:
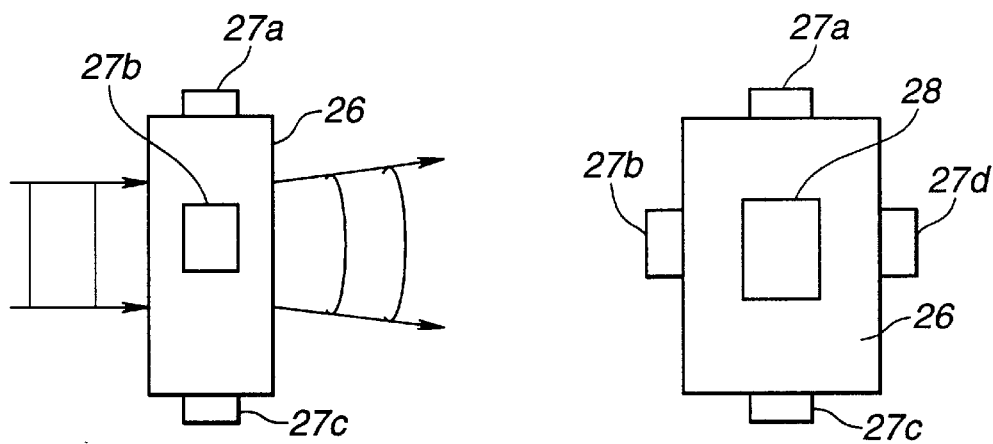

In FIGS. 3(c), (d), a wave front adjuster 20 is realized by intentionally applying a temperature distribution to a transmission-type optical device substrate 26, generating a refractive index distribution in the substrate 26. FIG. 3(d) is a plan view of FIG. 3(c). That is, in accordance with providing on each of four sides of a quartz glass substrate 26, for example, a heating/cooling mechanism 27a–27d capable of heating and cooling, like a thermoelectric device, and controlling the temperature of each of these heating/cooling mechanisms 27a–27d, a desired refractive index distribution is applied to the quartz glass substrate 26. Furthermore, in FIG. 3(d). 28 is the area through which the laser beam passes.

Next, the inspection procedure of the embodiment of FIG. 2 is described with reference to the flowchart of FIG. 4.

First, in the initial step, it is a state, wherein a total reflection mirror 6 is provided on the optical path between the collimator lens 16 and the narrowband module 1. In this step, while viewing the inspection device 8 monitor, optical axis adjustments of all optical mechanisms other than the narrowband module 1 of FIG. 2 are implemented so as to maximize the quantity of light intercepted by the light detector 7 (Step 100). Then, furnishing commands to the inspection device 8 in this state causes the inspection device 8 to capture the output of the light detector 7, and to measure the quantity of light Ib intercepted thereby (See FIG. 5)(Step 110). In this manner, it is possible to obtain the intensity of the spontaneously emitted energy of a light, the wavelength of which was selected via an interference filter 12.

Next, the above-mentioned total reflection mirror 6 is removed from the optical path (Step 120). Then, while viewing the inspection device 8 monitor, optical axis adjustments of the optical mechanisms 17, 18 inside the narrowband module 1 are implemented so as to maximize the quantity of light intercepted by the light detector 7 (Step 130). That is, the positions and angles of the 2 prisms of the prism beam expander 17 are adjusted, and furthermore, the angle of incidence of the incident light relative to the grating 18 is adjusted by adjusting the angle of rotation of the grating 18 so that the selected wavelength thereof matches up with the wavelength of the light source, that is, the interference filter 12 selected wavelength.

Figure 5:
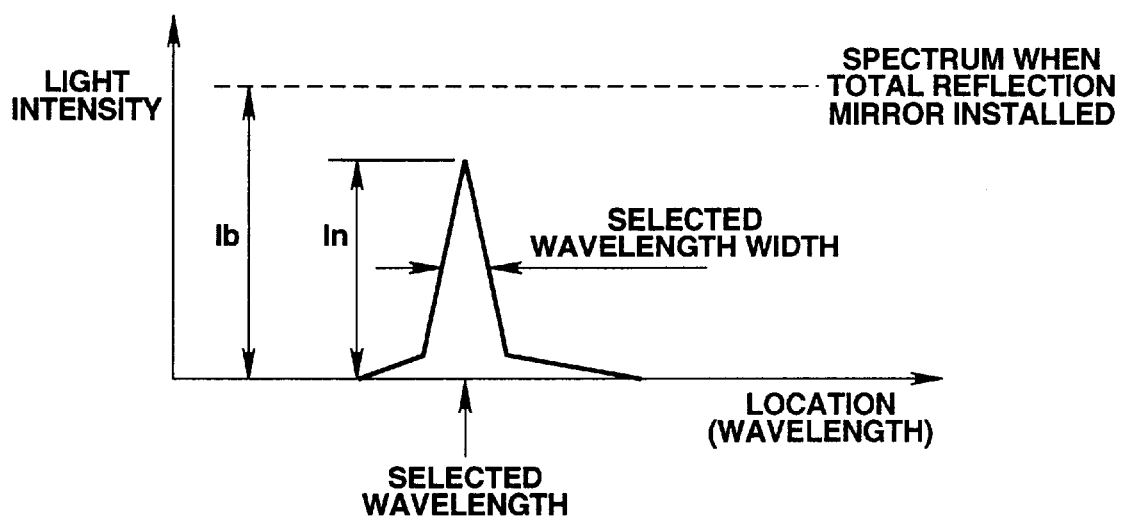
FIG. 5 is a diagram showing the output of a light detector.

Next, while viewing the inspection device 8 monitor, wave front adjustments in accordance with the wave front adjuster 20 inside the narrowband module 1 are implemented so as to minimize the divergent width (for example, full width at half maximum (FWHM) as shown in FIG. 5) of the light of the intercepted-light output of the light detector 7 (Step 140). That is, as shown in FIG. 5, the intensity distribution of bandwidth-narrowed light is obtained from the intercepted-light output of the light detector 7, but since the light-intercepting position thereof corresponds to the wavelength, the full width at half maximum of the intensity distribution corresponds to the spectral line width. Therefore, adjusting the wave front so as to minimize the full width at half maximum of the intercepted-light output of the light detector 7 works to minimize the spectral line width.

Then, furnishing commands to the inspection device 8 in this state causes the inspection device 8 to capture the output of the light detector 7, and to measure the quantity of light In intercepted thereby (See FIG. 5)(Step 150).

Then, the inspection device 8 finds the ratio between the quantity of intercepted light Ib captured previously, and the quantity of intercepted light In captured this time, that is, the narrowband efficiency Ef (=In/Ib) (Step 160). Further, the inspection device 8 compares the narrowband efficiency Ef determined in this manner against a tolerance value set previously, and when the narrowband efficiency Ef is within tolerance, creates a display on the monitor to the effect that the item is acceptable, and when the narrowband efficiency Ef is not within tolerance, creates a display on the monitor to the effect that the item is unacceptable, thereby informing the operator as to the quality of the relevant narrowband module. Furthermore, narrowband efficiency Ef determined in this manner constitutes an important index for evaluating the output power of the laser system in which the pertinent narrowband module is mounted.

That is, the intensity of the light generated from monochromatic light emitting means normally has an intensity-wavelength distribution that varies in accordance with the wavelength, so that simply detecting the intensity of the light outputted from a narrowband module alone does not enable an absolute evaluation to be made regarding the light intensity of light narrowed by the narrowband module 1.

Accordingly, the ratio between the spontaneously emitted light of a monochromatic light source and narrowband light, which are received via the same optical system, is found, and the narrowband output efficiency of a narrowband module is evaluated in accordance with this ratio.

Further, this inspection system, as described above, is constituted so that wavelength selection characteristics (selected center wavelength, spectral line width, and so forth) of a narrowband module 1 are evaluated based on the output of the light detector 7.

Figure 4:
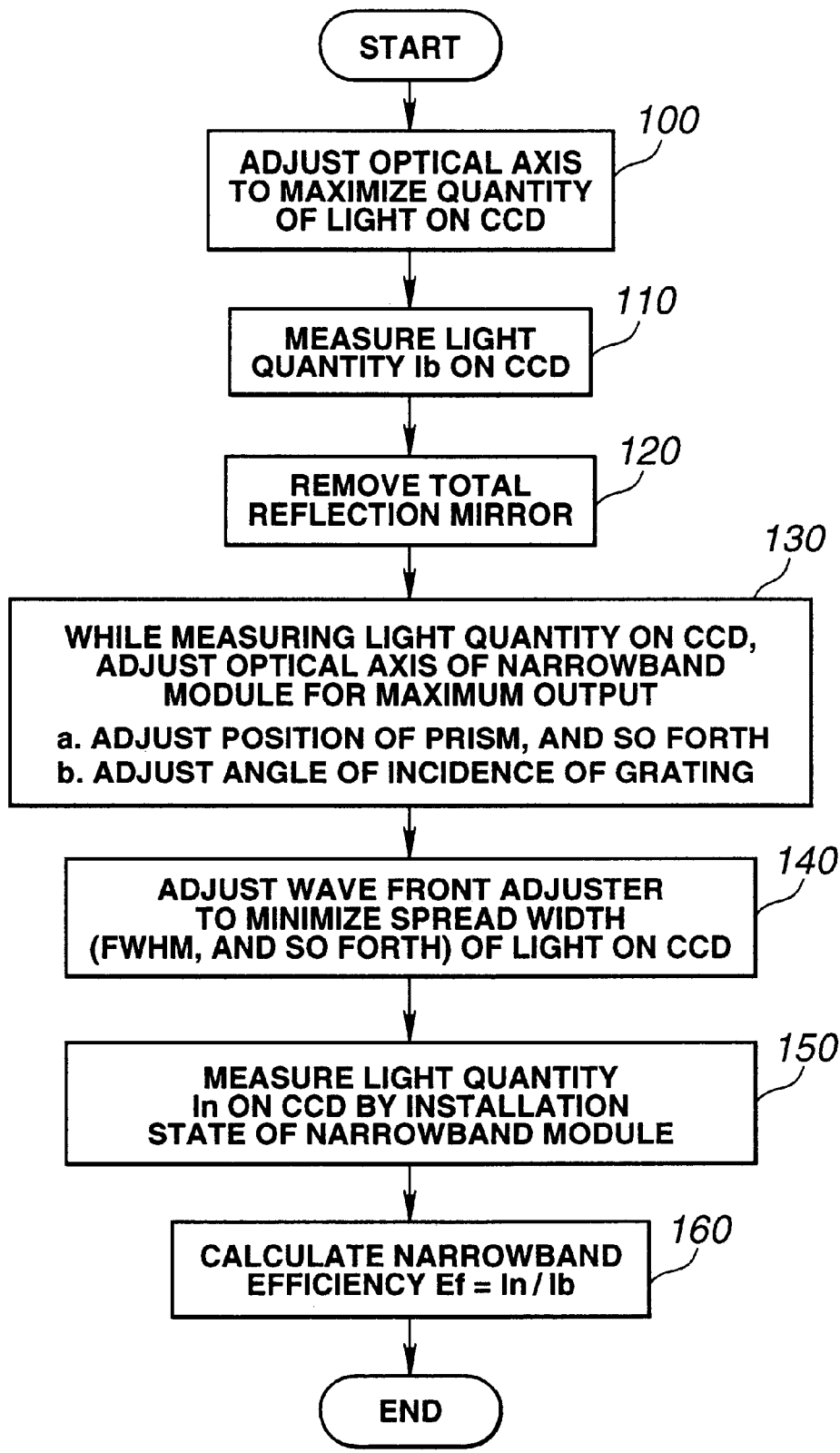
FIG. 4 is a flowchart showing the inspection procedures of the embodiment of FIG. 2.

Furthermore, the inspection procedures shown in FIG. 4 can also be constituted so that initially the total reflection mirror 6 is removed, the returning light from the narrowband module 1 is incident on the light detector 7, and the light intensity In thereof is detected, and thereafter, the total reflection mirror 6 is provided on the optical path, and the light intensity Ib thereof is detected.

In this manner, with this embodiment, it becomes possible to inspect, using a simple constitution and a brief inspection period without utilizing a real laser, narrowband efficiency, which constitutes an important index for confirming the narrowband performance of a narrowband module, and wavelength selection characteristics.

Figure 6:
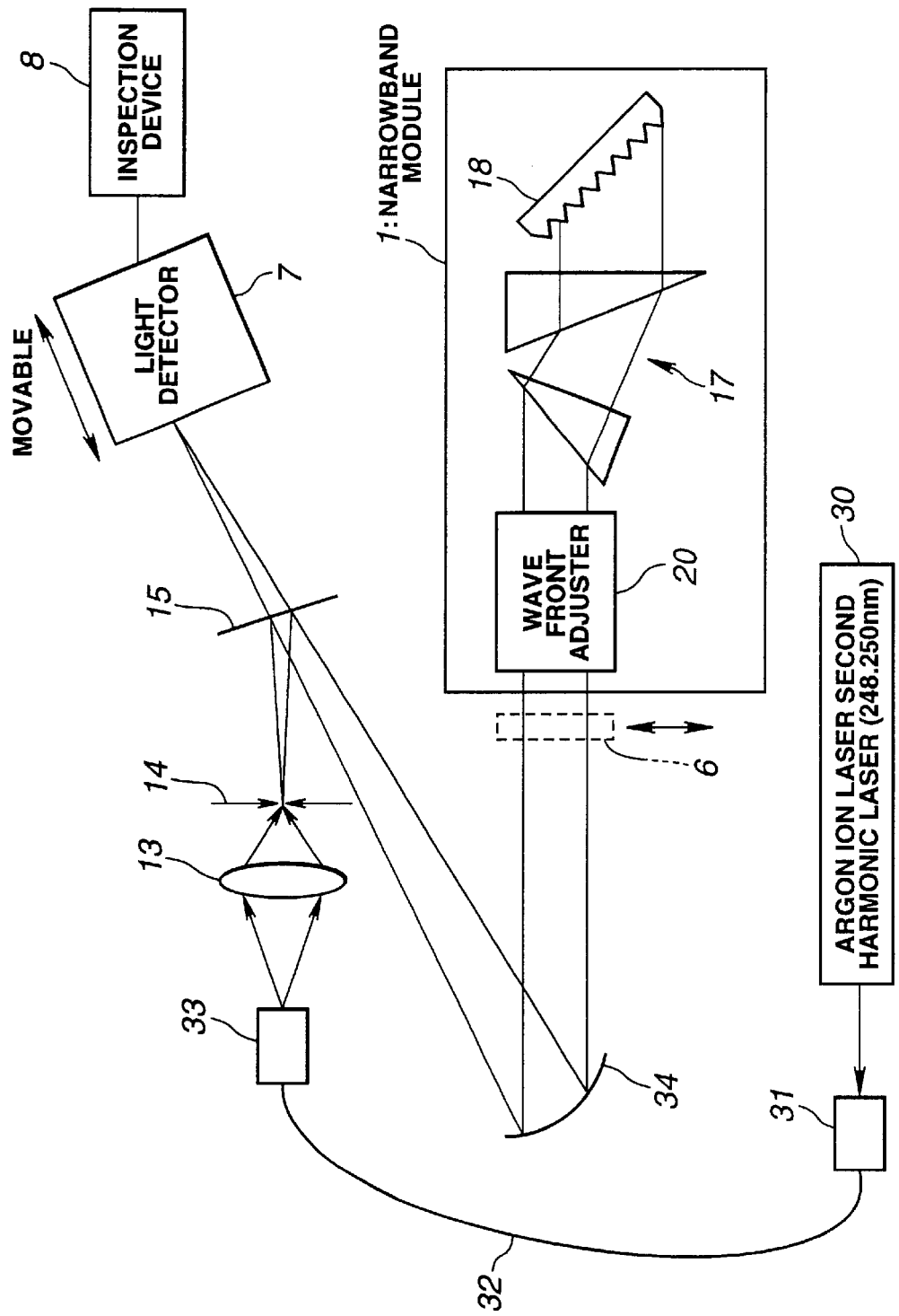
FIG. 6 is a diagram showing another embodiment of the present invention.

FIG. 6 shows another embodiment of the present invention.

The embodiment of FIG. 6 utilizes as a monochromatic light source a 248.25 nm line, which is the second harmonic of an argon laser, and is constituted so as to guide the laser beam thereof to a condensing lens 13 via a fiberoptic sleeve 31, an optical fiber 32, and a fiberoptic sleeve 33. It is further constituted so as to perform collimation utilizing an off-axis parabolic mirror 34 instead of the collimator lens 16 of FIG. 2.

An off-axis parabolic mirror is advantageous in that, since chromatic aberration and spherical aberration do not occur as with a collimator lens 16, a plurality of types of narrowband modules having different narrowband wavelength regions are inspected simply by replacing the monochromatic light source 30 with one whose emitted wavelength region differs therefrom. For example, when inspecting a narrowband module for a KrF excimer laser, as described above, a light source that generates an emission line or laser beam between 248.1–248.6 nm is utilized, and when inspecting a narrowband module for an KrF excimer laser, both narrowband modules can be inspected simply by replacing the light source thereof with a light source that generates an emission line or laser beam between 193.0–193.9 nm.

In this embodiment, too, similar to the embodiment of FIG. 2 above, the narrowband efficiency Ef of a narrowband module 1 is determined based on the output of a light detector 7 in states wherein a total reflection mirror 6 is provided and removed, and furthermore, the wavelength selection characteristics of the narrowband module 1 can be inspected based on the wavelength and spectral line width obtained from the output of the light detector 7. Further, it is also possible to make adjustments so as to minimize the spectral line width by adjusting, in accordance with a wave front adjuster 20, the wave front incident on the prism expander 17 and grating 18.

However, in the embodiment of FIG. 6, when wave front control is performed, since the focal point location of the off-axis parabolic mirror 34 changes in accordance with the wave front adjustment thereof, the light detector 7 is constituted so as to be able to move in the direction of the optical axis. That is, as described above, when observing the spectral width in accordance with the light detector 7 while changing the wave front in accordance with the wave front adjuster 20, since the spectral width changes only in accordance with changes in the wave front, the adjusting state of the wave front adjuster 20 is affixed at a wave front for which the width thereof becomes the narrowest. As a result, since the focal point location of the off-axis parabolic mirror 34 before adjustment changes following adjustment, this embodiment is constituted so that the light detector 7 is moved to the focal point location of the off-axis parabolic mirror 34 either during adjustment or after adjustment. For example, compared to the focal point location when a flat wave is reflected, the focal point location when a convex wave is reflected is farther away, and the focal point location when a concave wave is reflected is closer.

Figure 7:
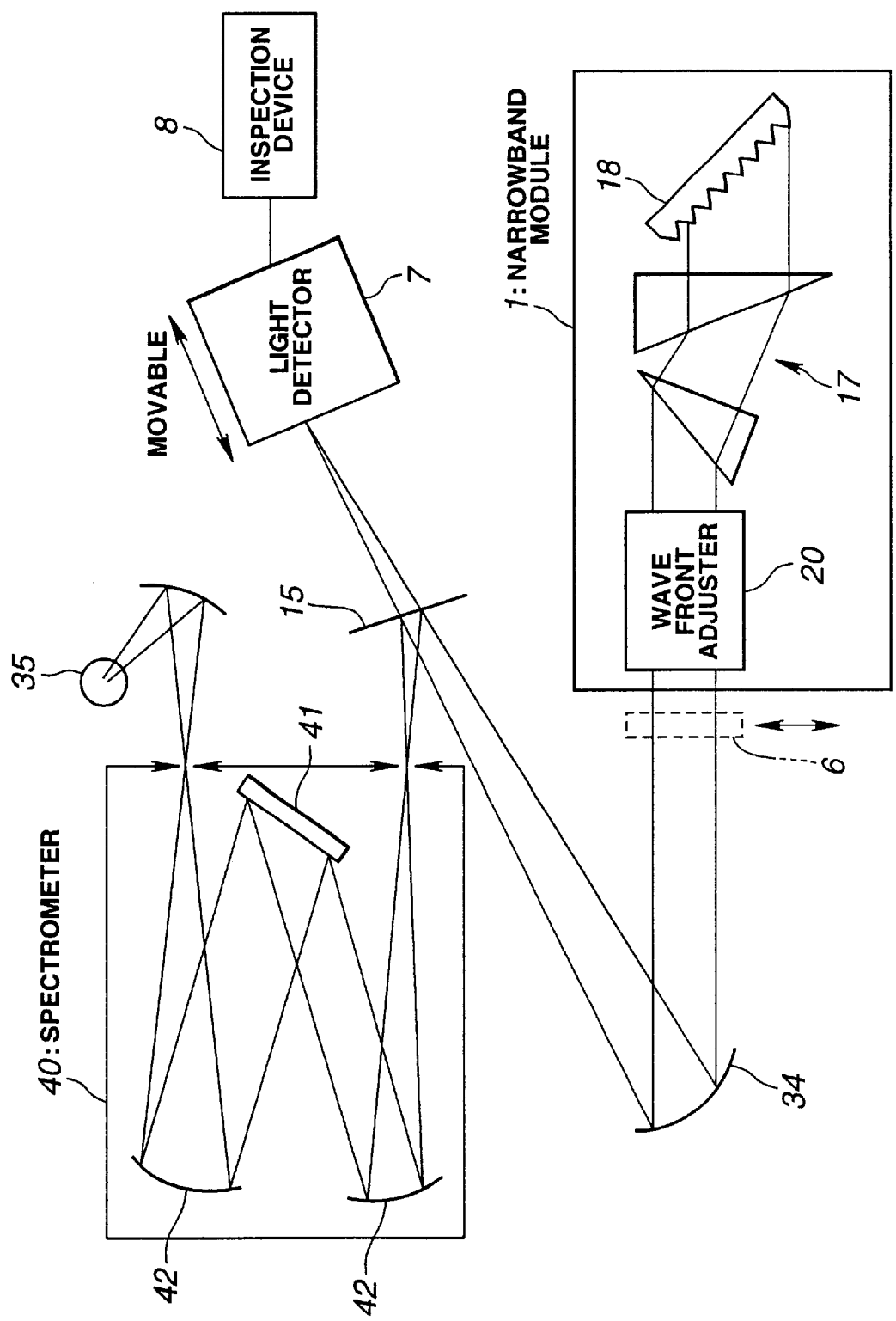
FIG. 7 is a diagram showing yet another embodiment of the present invention.

FIG. 7 shows yet another embodiment of the present invention.

In this embodiment, the constitution is such that a deuterium lamp is utilized as the light source 35, and furthermore, a spectrometer 40 is utilized as a wavelength selection device instead of the interference filter 12 of FIG. 2 above.

A deuterium lamp 35 generates a relatively wideband spectrum at near both the 248.3 nm wavelength region of a KrF excimer laser, and the 193 nm wavelength region of an Krf excimer laser. As for the spectrometer 40, a Czerny-Turner system, that uses a diffraction grating 41 and 2 concave mirrors 42, 43, is utilized in this case, and the embodiment is constituted so the light of a selected wavelength region, which is narrowed by a narrowband module 1, is dispersed and extracted using this spectrometer 40. Other constitutions and operations are the same as the embodiment shown in FIG. 6 above.

In this embodiment, it is possible to inspect the narrowband performance of a narrowband module 1 for a KrF excimer laser and for an KrF excimer laser without replacing lamps.

Figure 8:
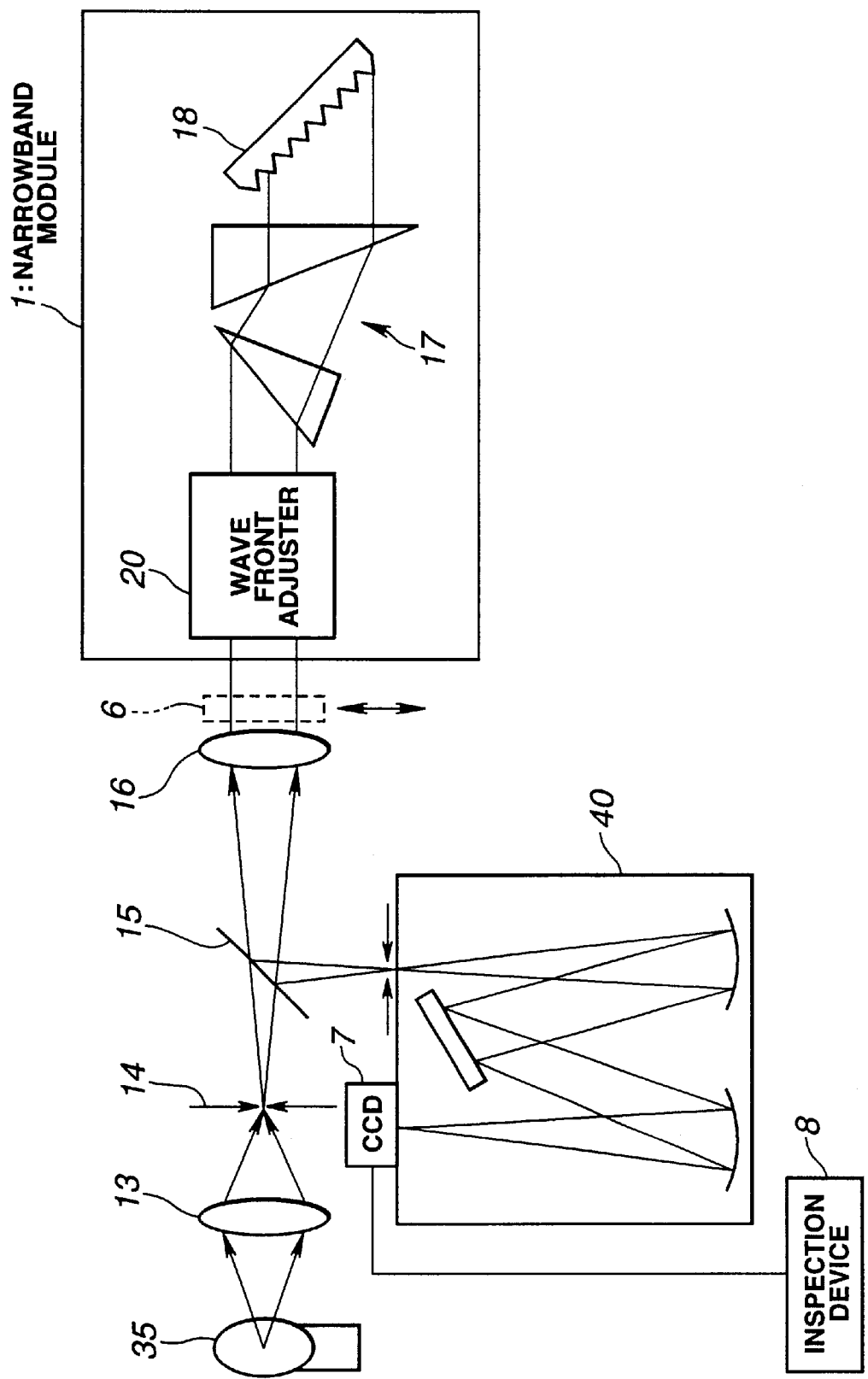
FIG. 8 is a diagram showing yet another embodiment of the present invention.

FIG. 8 shows yet another embodiment of the present invention.

In this embodiment, similar to the embodiment of FIG. 7 above, a lamp, which generates a wideband spectrum at near both the 248.3 nm wavelength region of a KrF excimer laser, and a 193 nm wavelength region of an KrF excimer laser, like a deuterium lamp, is utilized as the light source 35. Further, in this case, the embodiment is constituted so that the spectrometer 40 is not provided on the incoming radiation side relative to the narrowband module 1, but rather is provided on the outgoing radiation side of the narrowband module 1. In this embodiment, too, narrowband efficiency Ef of a narrowband module 1 is measured based on the output of a light detector 7 in states, wherein a total reflection mirror 6 is provided and removed, similar to the above embodiment, and furthermore, wavelength selection characteristics of a narrowband module 1 can be inspected based on the wavelength and spectral line width obtained from the output of the light detector 7. Further, adjustments are made so as to minimize the spectral line width by adjusting, in accordance with a wave front adjuster 20, the incoming radiation wave front to the prism expander 17 and grating 18.

Figure 9:
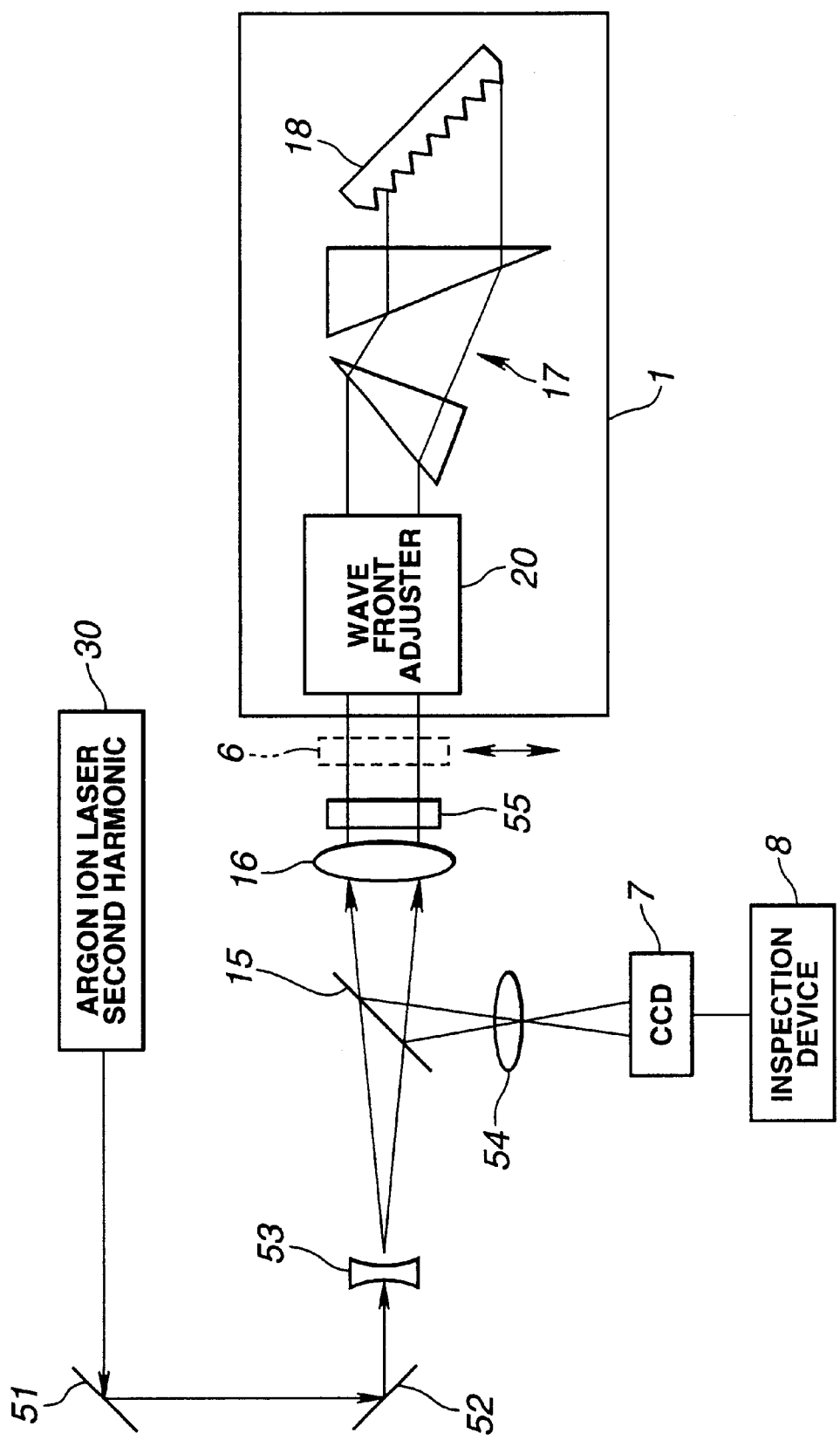
FIG. 9 is a diagram showing yet another embodiment of the present invention.

FIG. 9 shows yet another embodiment of the present invention.

The embodiment shown in FIG. 9 is constituted so as to use a Fizeau interferometer to generate an interference fringe, and to measure a wave front in accordance with this interference fringe.

In this case, a 248.25 nm laser beam, which is the second harmonic of an argon ion laser, is generated from a light source 30. That is, an argon ion laser has a fundamental wave of 496.5 nm, but a wavelength selecting device, such as an etalon, is provided inside the resonator of this argon ion laser, and in accordance with selecting 1 longitudinal mode, the spectral line width is narrowed, and a 248.25 nm laser beam is outputted by passing the fundamental wave thereof through a BBO or other second harmonic converting device.

This laser beam, after going by way of two mirrors 51, 52, is spread in accordance with a diffusing lens 53, after which the laser beam passes through a beam splitter 15, and is converted to a collimated beam in accordance with a collimator lens 16.

Then, in accordance with a semi-transparent mirror 55, which is constituted by an optical flat, a portion of the laser beam passes through, and the remaining portion is reflected.

The light reflected by the semi-transparent mirror 55 goes by way of the collimator lens 16 and beam splitter 15, and is incident on a condensing lens 54, and the condensed light is incident on a light detector 7 as first-order light.

The light that passes through the semi-transparent mirror 55 is incident on a narrowband module 1, and after going by way of a wave front adjuster 20 and prism 17, is incident on a grating 18, and the diffracted light thereof is emitted from the narrowband module 1 once again via the prism 17 and wave front adjuster 20. The light emitted from the narrowband module 1 passes through the semi-transparent mirror 55, after which it is incident on the condensing lens 54 via the beam splitter 15, and the condensed light is incident on the light detector 7 as second-order light.

In this manner, first-order light and second-order light interfere, and an interference fringe is formed on the light detector 7, which constitutes a CCD.

Therefore, measuring the interference fringe on the CCD 7 in accordance with the inspection device 8 enables inspection of the spectral structure of light narrowed by the narrowband module 1, and the state of the wave front incident on the narrowband module 1, and makes it possible to evaluate the wavelength selection characteristics of the narrowband module 1. Further, the narrowband efficiency Ef of the narrowband module 1 can be determined on the basis of the output of the light detector 7 in states, wherein the total reflection mirror 6 is provided and removed, similar to the above embodiments.

Furthermore, in the case of a Fizeau interferometer, an interference fringe cannot be generated unless a laser light source with a long coherence distance (a narrow spectral line width) is used as the light source 30.

Figure 10:
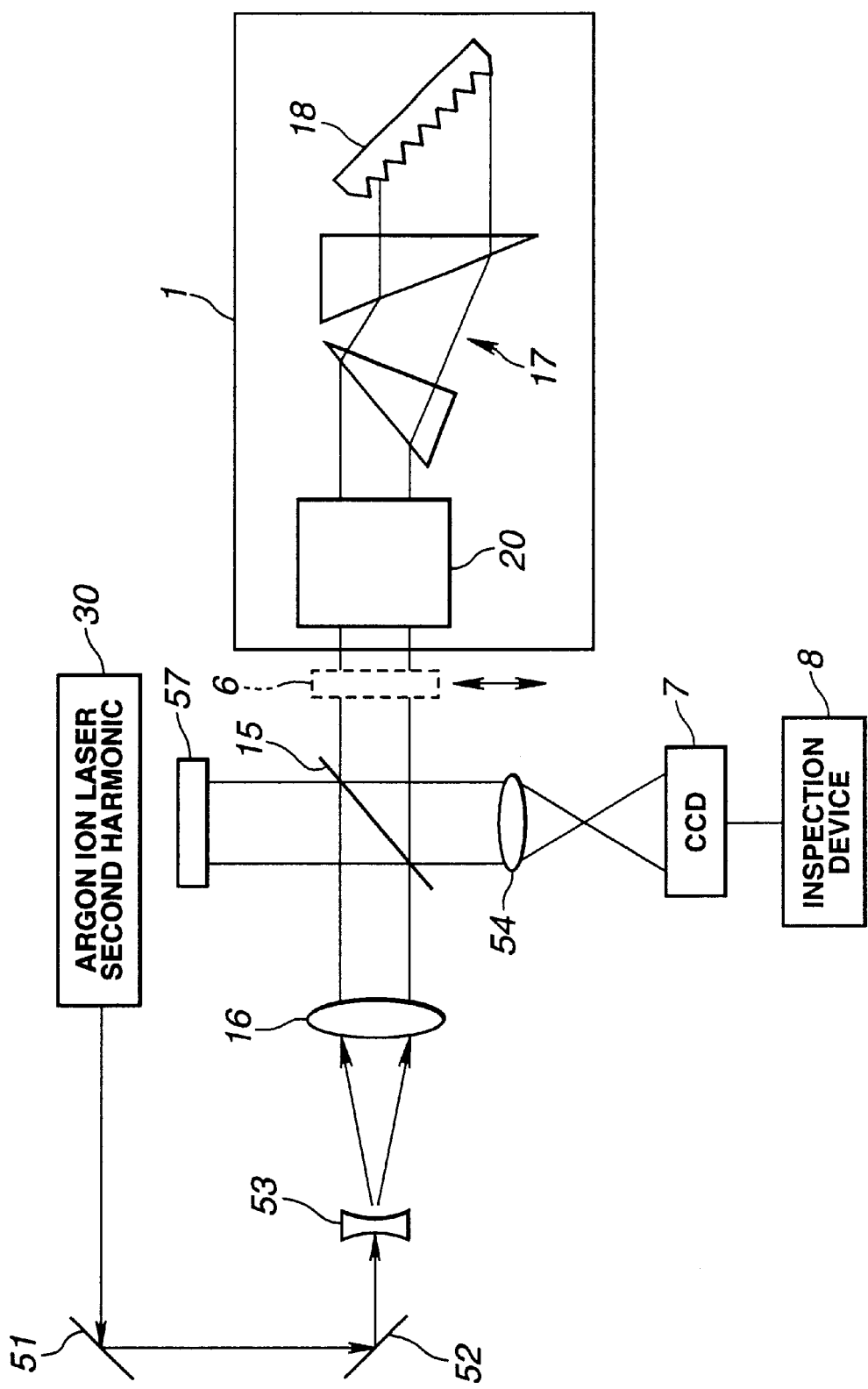
FIG. 10 is a diagram showing yet another embodiment of the present invention.

FIG. 10 is an embodiment, which is constituted so as to inspect the narrowband performance of a narrowband module 1 using a Michelson interferometer.

That is, in this case, a portion of a collimated beam from a collimator lens 16 is reflected by a beam splitter 15, and is incident on a total reflection mirror 57, which constitutes an optical flat, and the remaining portion of the collimated beam is transmitted and is incident on a narrowband module 1.

Therefore, the light reflected by the total reflection mirror 57 travels via the beam splitter 15 and is incident on a condensing lens 54, and the condensed light is incident on a light detector 7 as first-order light, and the light emitted from the narrowband module 1 travels via the beam splitter 15 and is incident on the condensing lens 54, and the condensed light is incident on the light detector 7 as second-order light. In this manner, first-order light and second-order light interfere, forming an interference fringe on the light detector 7.

Therefore, in this case, too, measuring the interference fringe on the CCD 7 in accordance with the inspection device 8 enables inspection of the wavelength selection characteristics (spectral structure) of light narrowed by the narrowband module 1, and the state of the wave front incident on the narrowband module 1. Further, the narrowband efficiency Ef of the narrowband module 1 can be determined on the basis of the output of the light detector 7 in states, wherein the total reflection mirror 6 is provided and removed, similar to the above embodiments.

Furthermore, in the case of a Michelson interferometer, there is the advantage that, even when the coherence distance is short, an interference fringe can be generated in accordance with adjusting the location of the total reflection mirror 57. Therefore, an interference fringe can be generated even when using the emission line of an Hg, Fe, As or other lamp as a light source.

Figure 11:
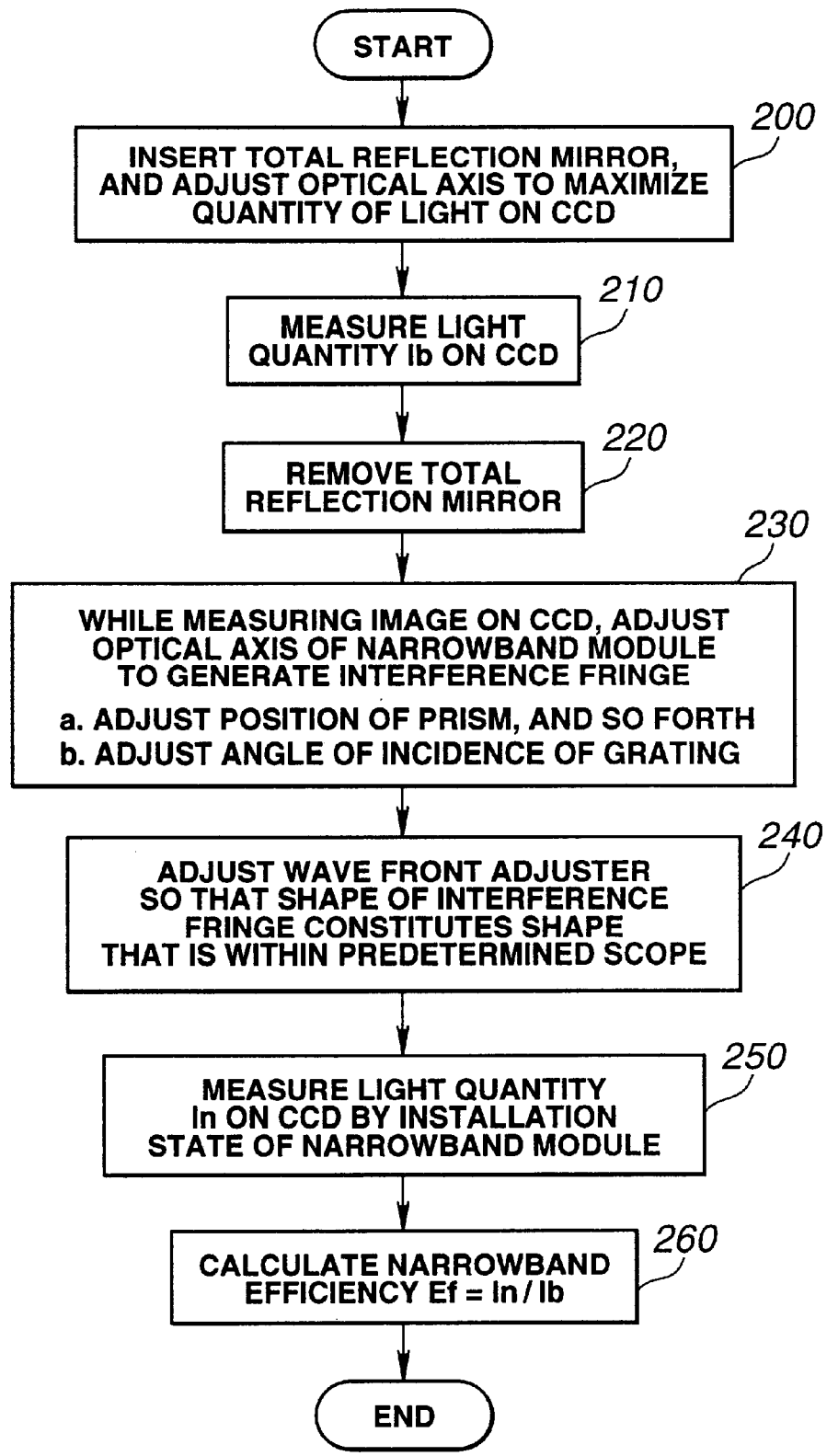
FIG. 11 is a flowchart showing the inspection procedures of the embodiments of FIG. 9 and FIG. 10.

FIG. 11 shows the inspection procedure of the embodiment of FIG. 9 or FIG. 10, and the inspection procedure of the embodiment of FIG. 9 or FIG. 10 is described hereinbelow with reference to the flowchart of FIG. 11.

First, in the initial step, it is a state, wherein a total reflection mirror 6 is provided on the optical path between a collimator lens 16 and a narrowband module 1. In this step, while viewing the inspection device 8 monitor, optical axis adjustments of all optical mechanisms other than the narrowband module 1 are implemented so as to maximize the quantity of light intercepted by the light detector 7 (Step 200). Then, furnishing commands to the inspection device 8 in this state causes the inspection device 8 to capture the output of the light detector 7, and to measure the quantity of light Ib intercepted thereby (See FIG. 5)(Step 210).

Next, the above-mentioned total reflection mirror 6 is removed from the optical path (Step 220). Then, while viewing the inspection device 8 monitor, optical axis adjustments of the optical mechanisms 17, 18 inside the narrowband module 1 are implemented so as to generate an interference fringe (Step 230). That is, the positions and angles of the 2 prisms of the prism beam expander 17 are adjusted, and furthermore, the angle of incidence of the incoming radiation relative to the grating 18 is adjusted by adjusting the angle of rotation of the grating 18 so that the selected wavelength thereof matches up with the wavelength of the light source 30.

Next, while viewing the inspection device 8 monitor, wave front adjustments in accordance with a wave front adjuster 20 inside the narrowband module 1 are implemented so that the shape of the interference fringe constitutes a shape that falls within a predetermined scope (Step 240). Then, furnishing commands to the inspection device 8 in this state causes the inspection device 8 to capture the output of the light detector 7, and to measure the quantity of light In intercepted thereby (See FIG. 5)(Step 250).

Then, the inspection device 8 finds the ratio between the quantity of intercepted light Ib captured previously, and the quantity of intercepted light In captured this time, that is, the narrowband efficiency Ef (=In/Ib) (Step 260).

Furthermore, the inspection device of the above-described present invention can be constituted so as to be applied to the inspection of an arbitrary laser system other than an excimer laser.

What is claimed is:

1. A narrowband module inspection device for inspecting a narrowband performance of a narrowband module, comprising:

light source means for generating a light, which radiates in a wavelength region of a narrowband laser beam;

a slit on which the light from the light source means is incident;

a collimating converter for converting the light via the slit to a collimated beam, and making-the converted light incident on the narrowband module;

condensing means for condensing outputted light from the narrowband module;

a light detector on which light condensed by the condensing means is incident;

a total reflection mirror provided in a removable manner on an optical path between the collimating converter and the narrowband module; and inspecting means for determining a ratio between the output of the light detector in a state wherein the total reflection mirror is provided on the optical path, and the output of the light detector in a state wherein the total reflection mirror is removed from the optical path, and for inspecting a narrowband efficiency of the narrowband module based on the determined ratio.

2. The narrowband module inspection device according to claim 1, wherein the inspecting means inspects wavelength selection characteristics of the narrowband module based on the output of the light detector in the state wherein the total reflection mirror is removed from the optical path.

3. The narrowband module inspection device according to claim 1, further comprising wave front adjusting means for adjusting a wave front of the incident narrowband laser beam and emitting onto the optical path between the narrowband module and the collimating converter.

4. A narrowband module inspection device for inspecting a narrowband performance of a narrowband module, comprising:

a wideband light source for generating a wideband light;

a slit on which the light from the wideband light source is incident;

a collimating converter for converting the light via the slit to a collimated beam, and making the converted light incident on the narrowband module;

condensing means for condensing outputted light from the narrowband module;

a total reflection mirror provided in a removable manner on an optical path between the collimating converter and the narrowband module;

a spectrometer for dispersing light condensed by the condensing means;

a light detector on which the light dispersed by the spectrometer is incident; and inspecting means for determining a ratio between the output of the light detector in a state wherein the total reflection mirror is provided on the optical path, and the output of the light detector in a state wherein the total reflection mirror is removed from the optical path, and for inspecting a narrowband efficiency of the narrowband module based on the determined ratio.

5. The narrowband module inspection device according to claim 4, wherein the inspecting means inspects wavelength selection characteristics of the narrowband module based on the output of the light detector in the state wherein the total reflection mirror is removed from the optical path.

6. The narrowband module inspection device according to claim 4, further comprising wave front adjusting means for adjusting a wave front of the incident narrowband laser beam and emitting onto the optical path between the narrowband module and the collimating converter.

7. A narrowband module inspection device for inspecting a narrowband performance of a narrowband module, comprising:

light source means for generating a light, which radiates in a wavelength region of a narrowband laser beam;

a collimating converter for converting monochromatic light from the light source means to a collimated beam;

an interferometer for dividing the converted collimated beam into two beams, making one of the beams incident on the narrowband module, and causing a return light from the narrowband module to interfere with the other one of the two divided beams;

a total reflection mirror provided in a removable manner on an optical path between the collimating converter and the narrowband module;

a condensing means for condensing outputted light of the interferometer;

a light detector on which light condensed by the condensing means is incident; and inspecting means for determining a ratio between the output of the light detector in a state wherein the total reflection mirror is provided on the optical path, and the output of the light detector in a state wherein the total reflection mirror is removed from the optical path, and for inspecting a narrowband efficiency of the narrowband module based on the determined ratio.

8. The narrowband module inspection device according to claim 7, wherein the inspecting means inspects wavelength selection characteristics of the narrowband module based on an interference fringe produced from the output of the light detector in the state wherein the total reflection mirror is removed from the optical path.

9. The narrowband module inspection device according to claim 7, further comprising wave front adjusting means for adjusting a wave front of the incident narrowband laser beam and emitting onto the optical path between the narrowband module and the collimating converter.

* * * * *